United States Patent
Shank et al.

(10) Patent No.: US 10,224,396 B1
(45) Date of Patent: Mar. 5, 2019

(54) DEEP TRENCH ISOLATION STRUCTURES

(71) Applicant: GLOBALFOUNDRIES INC., Grand Cayman (KY)

(72) Inventors: Steven M. Shank, Jericho, VT (US); Daisy Vaughn, Stowe, VT (US); Thai Doan, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/817,629

(22) Filed: Nov. 20, 2017

(51) Int. Cl.
*H01L 29/00* (2006.01)
*H01L 29/06* (2006.01)
*H01L 21/762* (2006.01)

(52) U.S. Cl.
CPC .... *H01L 29/0649* (2013.01); *H01L 21/76229* (2013.01)

(58) Field of Classification Search
CPC ......... H01L 27/11517; H01L 21/28273; H01L 21/764; H01L 21/76224; H01L 29/0653; H01L 21/7682; H01L 29/0649; H01L 21/823481
USPC .................................................. 257/510, 522
See application file for complete search history.

(56) References Cited

U.S. PATENT DOCUMENTS

| | | | |
|---|---|---|---|
| 7,038,289 B2 * | 5/2006 | Marty | ............... H01L 21/76232 257/501 |
| 7,339,253 B2 | 3/2008 | Tsai et al. | |
| 7,396,732 B2 | 7/2008 | Kunnen | |
| 9,269,609 B2 * | 2/2016 | Shue | ................. H01L 21/76283 |
| 2006/0252257 A1 * | 11/2006 | Ahn | ................. H01L 21/76232 438/637 |
| 2010/0032796 A1 * | 2/2010 | Brown | ............. H01L 21/76289 257/510 |
| 2011/0062547 A1 | 3/2011 | Onishi et al. | |
| 2011/0175205 A1 | 6/2011 | Morii et al. | |
| 2012/0205774 A1 | 8/2012 | Wang | |
| 2012/0205806 A1 | 8/2012 | Yelehanka et al. | |
| 2013/0175661 A1 | 7/2013 | Cai et al. | |
| 2013/0320459 A1 | 12/2013 | Shue et al. | |
| 2014/0291767 A1 | 10/2014 | Lee et al. | |
| 2016/0163749 A1 | 6/2016 | Yang et al. | |
| 2017/0221839 A1 | 8/2017 | Kononchuk et al. | |

FOREIGN PATENT DOCUMENTS

| | | |
|---|---|---|
| CN | 102157431 | 8/2011 |
| TW | 201351565 | 12/2013 |

OTHER PUBLICATIONS

Application and Drawings for U.S. Appl. No. 15/372,929, filed Dec. 8, 2016, 23 pages.

(Continued)

*Primary Examiner* — Roy K Potter
(74) *Attorney, Agent, or Firm* — Anthony Canale; Andrew M. Calderon; Roberts Mlotkowski Safran Cole & Calderon P.C.

(57) ABSTRACT

The present disclosure relates to semiconductor structures and, more particularly, to deep trench isolation structures and methods of manufacture. The structure includes: at least one gate structure on a substrate; an interlevel dielectric material above the substrate; and a trench isolation structure extending into the substrate adjacent to the at least one gate structure and terminating in the interlevel dielectric material above the substrate.

20 Claims, 3 Drawing Sheets

(56) References Cited

OTHER PUBLICATIONS

Taiwanese Office Action in related TW Application No. 107103878 dated Aug. 8, 2018, 10 pages.
German Office Action in related DE Application No. 10 2018 202 253.4 dated Jul. 25, 2018, 12 pages.

* cited by examiner

DEEP TRENCH ISOLATION STRUCTURES

FIELD OF THE INVENTION

The present disclosure relates to semiconductor structures and, more particularly, to deep trench isolation structures and methods of manufacture.

BACKGROUND

Radio frequency (RF) devices are used in many different types of communication applications. For example, RF devices can be used in cellular telephones with wireless communication components such as switches, MOSFETs, transistors and diodes.

As cellular telephones become more complex and commoditized, there is an increasing need to provide higher performance and lower price points for the wireless communication components. A significant fraction of the cost of manufacturing an RF switch, for example, is the cost to engineer very high linearity such that harmonic distortion is extremely low and meets product specifications.

RF devices are typically manufactured on high resistivity silicon wafers or substrates to achieve the needed rf linearity. State-of-the-art trap rich silicon on insulator (SOI) high resistivity substrates offer excellent vertical isolation and linearity, but can be up to 50% of the total manufacturing cost because they can be quadruple the cost of a high resistivity non-SOI substrates. i.e., a rf device formed on a trap rich SOI wafer could have a total normalized manufacturing cost of 1.0 while a similar device formed on a high resistivity non-SOI bulk wafer could have a total normalized manufacturing cost of 0.6. Devices built on bulk Si substrates have been known to suffer from degraded linearity, harmonics, noise, and leakage currents, any of which will degrade device performance thus necessitating the higher cost of SOI wafers.

SUMMARY

In an aspect of the disclosure, a structure comprises: at least one gate structure on a substrate; an interlevel dielectric material above the substrate; and a trench isolation structure extending into the substrate adjacent to the at least one gate structure and terminating in the interlevel dielectric material above the substrate.

In an aspect of the disclosure, a structure comprises: at least one transistor on a bulk substrate; shallow trench isolation structures surrounding the at least one transistor; an interlevel dielectric material above the bulk substrate; and a deep trench isolation structure passing through the shallow trench isolation structures, extending below a depletion region of the bulk substrate, and terminating at its upper end in the interlevel dielectric material.

In an aspect of the disclosure, a method comprises etching a deep trench isolation structure with tapered sidewalls into a bulk substrate and at least isolating one transistor on a bulk substrate; and depositing an interlevel dielectric material over the deep trench structure. The interlevel dielectric material lines the deep trench isolation structure with insulator material and forms an airgap in combination with the deep trench isolation structure which terminates in the interlevel dielectric material with a pinch off.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to deep trench isolation structures and methods of manufacture. More specifically, the present disclosure relates to deep trench isolation structures used in radio frequency (RF) switches. Advantageously, the deep trench isolation structures improve leakage currents, noise, and linearity (harmonics) for devices built on bulk Si substrates and high resistivity bulk Si substrates.

In embodiments, the deep trench isolation structures include an airgap which is embedded into an interlevel dielectric layer, e.g., oxide contact region, and further extends into a substrate terminating below a first (M1) metal level. In embodiments, the airgap can be lined with oxide, deposited during the formation of the interlevel dielectric layer, e.g., oxide contact region. This lining will further increase the electrical isolation benefits of the deep trench isolation structure. The deep trench isolation structures can have a shape in which the sidewall profile is scalloped to reduce resist erosion during etch, amongst other dimensions described herein. For example, the deep trench profile can have a retrograde profile, with a small top critical dimension (CD) in Si and a larger bottom CD in Si to avoid trench bottom pinch off, or vice versa.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
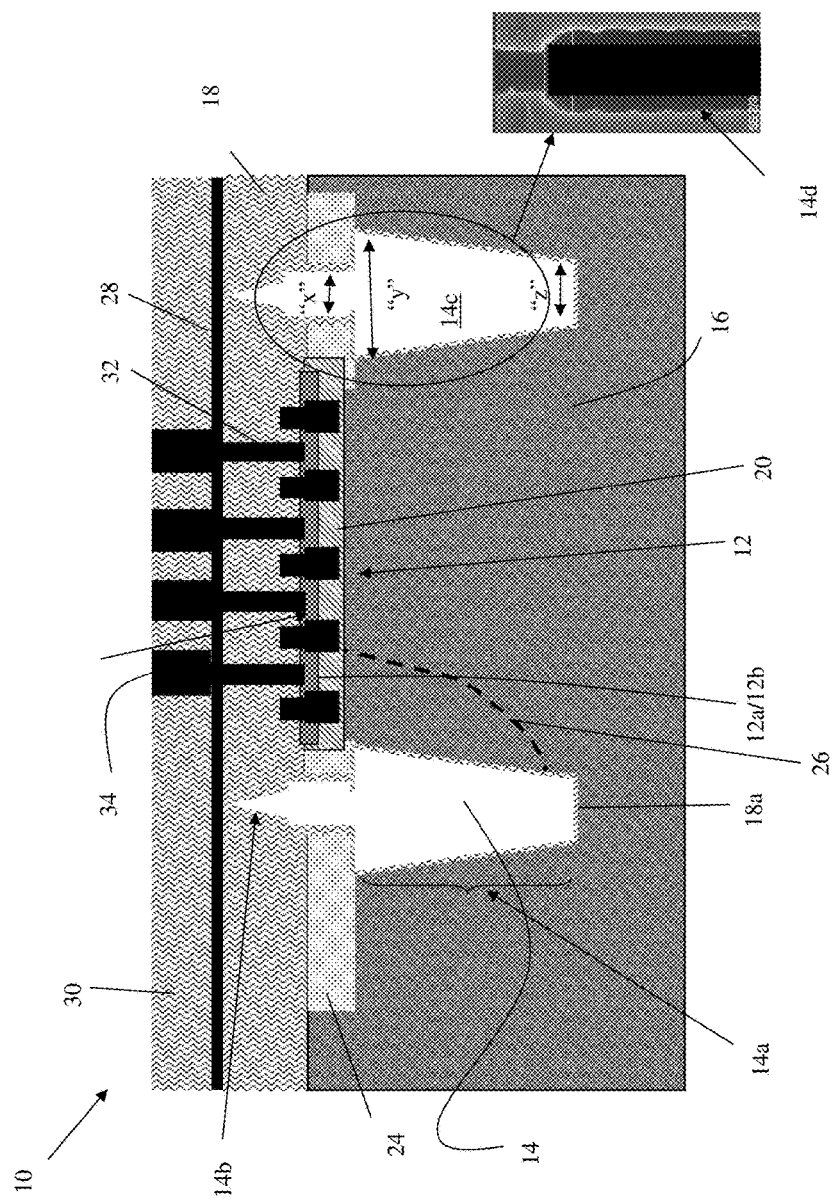
FIG. 1 shows deep trench isolation structures, amongst other features, and respective fabrication processes in accordance with aspects of the present disclosure.

FIG. 1 shows deep trench isolation structures, amongst other features, and respective fabrication processes in accordance with aspects of the present disclosure. In particular, the structure 10 of FIG. 1 includes at least one gate structure or transistor 12 (FETs) separated or surrounded by deep trench isolation structures 14. In embodiments, the FETs 12 can be RF switches and/or other active CMOS devices. As should be recognized, the deep trench isolation structures 14 surround the transistors or stack of the transistors 12 to provide isolation for depletion regions within a substrate 16. More specifically, by providing the deep trench isolation structures 14, it is now possible to prevent well to substrate depletion regions from merging, thereby reducing harmonics. Also, the deep trench isolation structures 14 can isolate n-triple well regions and p-well regions from adjacent n-triple well and p-well regions. In fact, the deep trench isolation structures 14 can be used with any active device with a different substrate bias.

In embodiments, the deep trench isolation trench structure 14 can be provided in a high-resistivity (>1 Kohm–cm) and ultra-high resistivity (>5 Kohm–cm) substrate 16. As should be understood by those of skill in the art, the substrate 16 can be a bulk Si substrate which will significantly reduce cost compared to SOI substrates. For example, as should be understood by those of skill in the art, bulk high resistivity Si substrates can cost 4 to 5 times less than high resistivity SOI substrates, which results in a significant cost savings in total manufacturing cost. Also, due to these cost savings, additional processing can be added to improve device performance, while still maintaining a significant cost advantage compared to SOI applications.

Still referring to FIG. 1, a well region 20 (e.g., p-well) is formed in the substrate 16 by any conventional ion implantation or diffusion process using, e.g., boron, to attain a suitable well depth and doping profile. The plurality of transistors 12 are formed on the substrate 16 and, preferably, within the p-well region 20. In embodiments, the transistors 12 can be active RF devices, e.g., RF switches, formed by conventional CMOS processes including deposition of gate dielectrics (e.g., high-k dielectrics such as hafnium oxide, etc.), followed by gate metals (e.g., different work function metals), patterning of the materials using lithography and etching (e.g., reactive ion etching (RIE) to form the gate stacks, followed by sidewall formation, e.g., oxide or nitride materials deposited on the gate stacks). Source regions and drain regions 12a, 12b can be formed within the substrate 16 or on the substrate 16 (for raised source and drain regions) using conventional dopant or ion implantation processes such that one of ordinary skill in the art would understand without requiring further explanation.

As further shown in FIG. 1, silicide regions 22 are formed on the source and drain regions 12a, 12b. In embodiments, the silicide process begins with deposition of a thin transition metal layer, e.g., nickel, cobalt or titanium, over fully formed and patterned semiconductor devices (e.g., doped or ion implanted source and drain regions 12a, 12b and respective devices 12). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 22 in the active regions of the devices, e.g., transistors 12. A barrier layer can be formed over the silicide contacts 22 in the active regions of the devices, e.g., transistors 12. The barrier layer can be a barrier nitride film deposited using a conventional deposition process, e.g., chemical vapor deposition (CVD) process.

Still referring to FIG. 1, shallow trench isolation (STI) structures 24 are formed in the substrate 16 and more specifically surrounding the transistors 12. In embodiments, the STI structures 24 can be formed through or within the p-wells 20 and can be composed of oxide material, as an example. The STI structures 24 can be formed using conventional lithography, etching and deposition steps, followed by a chemical mechanical polishing (CMP) step. In embodiments, the STI structures 24 can be formed prior to the formation of the transistors 12.

As further shown in FIG. 1, the deep trench isolation trench structures 14 extend through the STI structures 24, and into the substrate 16. In embodiments, the deep trench isolation structures 14 will be formed through the STI structures 24 and beyond a depth of the depletion region as shown representatively by the dashed line 26. As the depletion into the substrate 16 can be greater than 30 μm for resistivities greater than 10K ohm-cm, a depth of the deep trench isolation structures 12 of 30 μm or greater should be sufficient. For example, in embodiments, the deep trench isolation structures 12 can have a depth of about 10 μm to about 200 μm and preferably 65 μm to 100 μm, and more preferably 30 μm to 60 μm deep into the substrate 16. This depth provides isolation from well charges that produce harmonic distortion. In further embodiments, the depth of the deep trench isolation structures 14 can be chosen to be deeper than a worst-case depletion depth at the highest wafer resistivity specification (e.g., worst case at any post backside grind depth).

The deep trench isolation structures 14 can be formed by lithography and etching processes (e.g., RIE chemistries), followed by a deposition process, e.g., a combination of a sidewall oxidation and CVD oxide process for forming of the interlevel dielectric material 18. For example, a resist can be formed over the substrate 14 and exposed to energy (light) to form a pattern (opening). A RIE process with selective chemistries can be used to form a deep trench.

For example, a RIE process can be used to form the opening in the STI structures 24 (and any layers above such as any barrier layers, e.g., nitride layers, oxide layers, etc.), followed by a Bosch etch process in the Si substrate 16, which consists of alternating etch, using $SF_6$, and polymer deposition processes, as known in the art (see, e.g., US Publication No. 20090242512). By way of example, in order to provide a preferred deep trench profile, the etch ratio of polymer to Si can be about 1.5:4 and, in further embodiments, about 0.6:0.75 over, e.g., 200 cycles. In further embodiments, the etch time from the first etch cycle to the last etch cycle for both the polymer etch and Si etch can be increased; compared to a decrease in conventional processes. In addition, the polymer deposition cycle time will decrease over the cycles, e.g., the first deposition time will be greater than the last deposition time. This is compared to conventional deposition processes which increase over time. In this way, the deep trench can have a tapered profile (e.g., a retrograde profile). After the etching process, the resist can be stripped and the surface of the structure cleaned using conventional surface preparation (SP) cleaning process.

In embodiments, using the Bosch process, the deep trench isolation structure 14 can have a width "x" in the STI structure 24 of about 0.5 microns to about 1.5 micron; although other dimensions are contemplated herein based on the specific dimensions between the adjacent transistors 12. The width dimension "y" in the substrate 16 directly below the STI structure 24 can range from about 1.0 micron to about 2.0 microns; whereas the width "z" at the bottom of the trench will be narrower, e.g., about 0.2 microns to about 1 micron. In this way, the deep trench isolation structures 14 will have a vertically tapered sidewall profile 14a, e.g., "x"≠"y"≠"z" and "y">"z". In further embodiments, as shown in the enlarged cross sectional view, the vertically tapered sidewall profile 14a can also have a scalloped profile 14d which improves the process window with no breakdown degradation. Also, as the opening in the upper portion of the substrate 16 is wider than the opening in the STI structure 24, it is possible to use a single mask process with the deep trench isolation structure 14 terminating in the interlevel dielectric material 18 below a first metal layer, e.g., wiring 34.

FIG. 1 further shows the deep trench isolation structures 14 lined with an oxide material 18a or other insulator material, which is deposited during the deposition of the interlevel dielectric material (e.g., contact oxide layer) 18. In embodiments, the lining can be about, e.g., 100 nm to about 500 nm thick, deposited by a CVD process on the sidewalls of the deep trench isolation structure 14, during the deposition of the interlevel dielectric material (e.g., contact oxide layer) 18. During this lining process, the oxide will form a pinch-off 14b in the interlevel dielectric material 18, forming an airgap 14c in the deep trench isolation structure 14 extending from the interlevel dielectric material 18, through the STI structure 24 and into the substrate 16 to below the depletion region 26. It should be recognized by those of skill in the art that the lining 14a will further isolate the structures, reducing harmonics, etc.

As further shown in FIG. 1, the pinch-off 14b will remain below the surface of the insulator material, e.g., contact oxide layer 18, even after a planarization process, e.g., chemical mechanical polishing (CMP). For example, the pinch-off 14b should be about 1 micron and, preferably, about 0.7 microns or less below the surface of the interlevel dielectric material 18, ensuring that the subsequent processes, e.g., CMP process, will not open the seam (e.g., airgap). This location will prevent possible shorting or other failure mechanism of the device.

To prevent such opening of the seam, the interlevel dielectric material 18 can be deposited to a thickness of about 1.2 microns, as one non-limiting example. For example, in a 7 nm technology node, the interlevel dielectric material 18 can be deposited to a thickness of about 0.7 microns, with the height of the seam being about 0.32 microns, above the STI structure 24. As another example, the interlevel dielectric material 18 can be deposited to a thickness of about 1.2 microns, with the height of the seam being about 0.34 microns, above the STI structure 24. Also, those of skill in the art will understand that the width "y" under the STI structure 24 can also determine where the pinch-off 14b occurs, e.g., the pinch-off 14b will occur higher as the dimension "y" becomes wider.

As further shown in FIG. 1, in embodiments, the interlevel dielectric material 18, e.g., contact oxide layer, is deposited over the exposed surfaces of the structure, e.g., over the transistors 12. Additional layers of material 28, 30 can be deposited on the interlevel dielectric material 18 using conventional deposition processes, e.g., CVD. For example, layer 28 can be a barrier layer, e.g., SiN, and layer 30 can be an additional interlevel dielectric layer. Contacts 32 can be formed through the layers 18, 28, 30 using conventional lithography, etching and deposition of metal or metal alloy processes. The contacts 32 will be in direct contact with the silicide regions 22 and gate regions of the transistors (FETs) 12. Wiring layers and other back end of the line structures 34 are formed in electrical contact with the contacts 32 using, again, conventional CMOS deposition and patterning processes.

Figure 2:
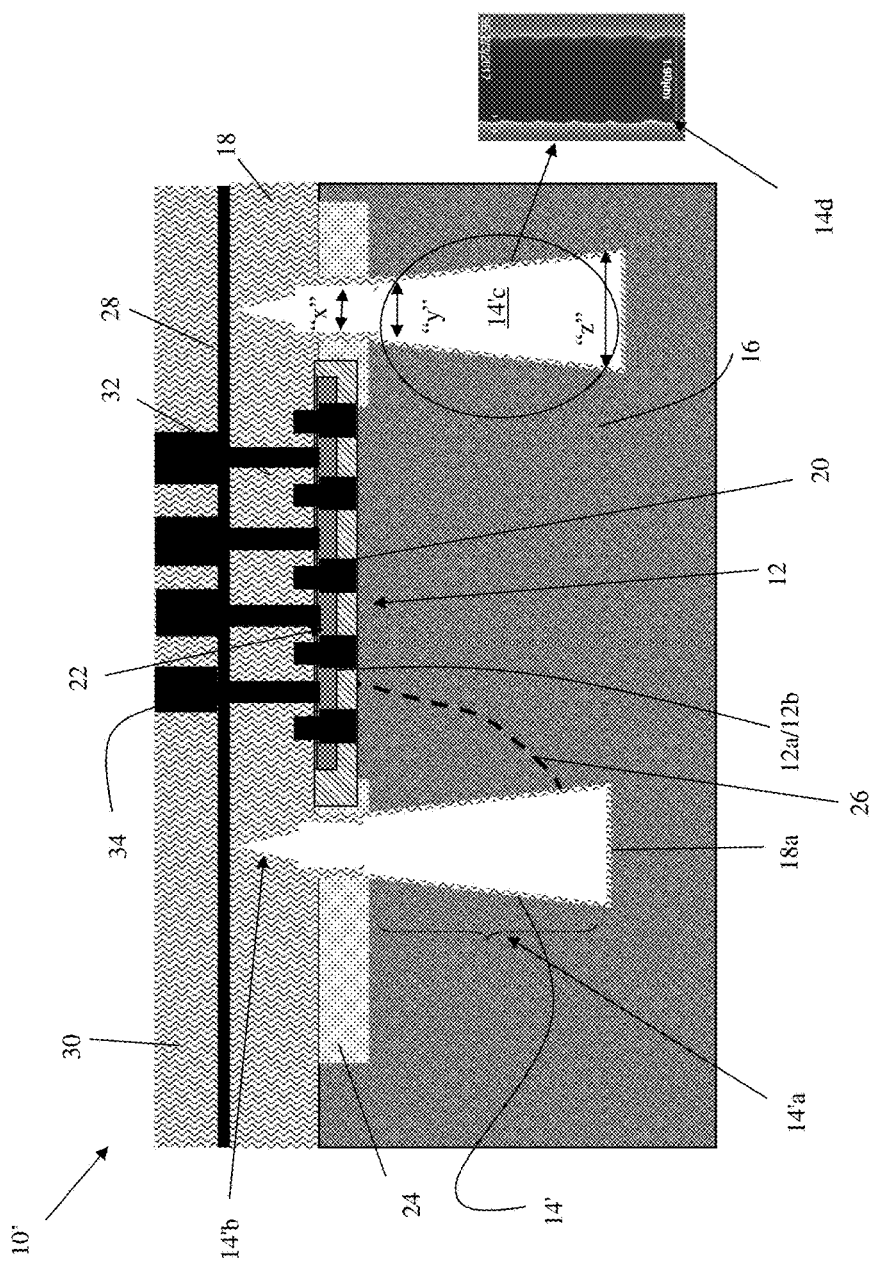
FIG. 2 shows deep trench isolation structures, amongst other features, and respective fabrication processes in accordance with additional aspects of the present disclosure.

FIG. 2 shows a deep trench isolation structure and respective fabrication processes in accordance with additional aspects of the present disclosure. More specifically, the structure 10' shown in FIG. 2 includes the structures, materials and processes described in FIG. 1, except that the deep trench isolation structure 14' has a retrograde profile 14'a to reduce top CD, thereby reducing pinch-off height 14'b.

In this embodiment, for example, the trench opening in the STI structure 24 can remain a width "x" of about 0.5 microns to about 1.5 micron; whereas, using the Bosch process, the width dimension "y" in the substrate 16 directly below the STI structure 24 will be in the range from about 0.5 microns to about 1.0 micron, and the width "z" at the bottom of the trench will have a wider profile, e.g., about 1 micron to about 2.0 microns. In this way, the deep trench isolation structures 28 will have a vertically tapered sidewall profile 14'a, e.g., "x"≠"y"≠"z" and "z">"y".

In further embodiments, as shown in the enlarged cross-sectional view, the vertically tapered sidewall profile 14'a can also have a scalloped profile 14d which improves process window with no breakdown degradation. Also, as the opening in the upper portion of the substrate 16 is wider than the opening in the STI structure 24, it is possible to use a single mask process with the deep trench isolation structure 14' terminating in the interlevel dielectric material 18 below a first metal layer, e.g., wiring 34.

FIG. 2 further shows the deep trench isolation structures 14' lined with an oxide material 18a or other insulator material, which is deposited during the deposition of the interlevel dielectric material (e.g., contact oxide layer) 18. In embodiments, the lining can be about, e.g., 100 nm to about 500 nm thick, deposited by a CVD process on the sidewalls of the deep trench isolation structure 14', during the deposition of the interlevel dielectric material (e.g., contact oxide layer) 18. During this lining process, the oxide will form a pinch-off 14'b in the interlevel dielectric material 18, forming an airgap 14'c in the deep trench isolation structure 14 extending from the interlevel dielectric material 18, through the STI structure 24 and into the substrate 16 to below the depletion region 26. It should be recognized by those of skill in the art that the lining 18a will further isolate the structures, reducing harmonics, etc.

As further shown in FIG. 2, the pinch-off 14'b will remain below the surface of the insulator material, e.g., contact oxide layer 18, even after a planarization process, e.g., chemical mechanical polishing (CMP). In embodiments, the pinch-off 14'b could be even lower than the embodiment of FIG. 1, due to the retrograde profile of the deep trench isolation structures 14'. As in the previous embodiment, the seam height can be a function of, e.g., the thickness of the interlevel dielectric material 18, the opening in the STI structure 24, as well as the profile 14'a of the deep trench isolation structure 14'.

FIG. 2 further shows additional layers of material 28, 30 deposited on the interlevel dielectric material 18 using conventional deposition processes, e.g., CVD. For example, layer 28 can be a barrier layer, e.g., SiN, and layer 30 can be an additional interlevel dielectric layer. Contacts 32 can be formed through the layers 18, 28, 30 using conventional lithography, etching and deposition of metal or metal alloy processes. The contacts 32 will be in direct contact with the silicide regions 22 and gate regions of the transistors (FETs) 12. Wiring layers and other back end of the line structures 34 are formed in electrical contact with the contacts 32 using, again, conventional CMOS deposition and patterning processes.

Figure 3:
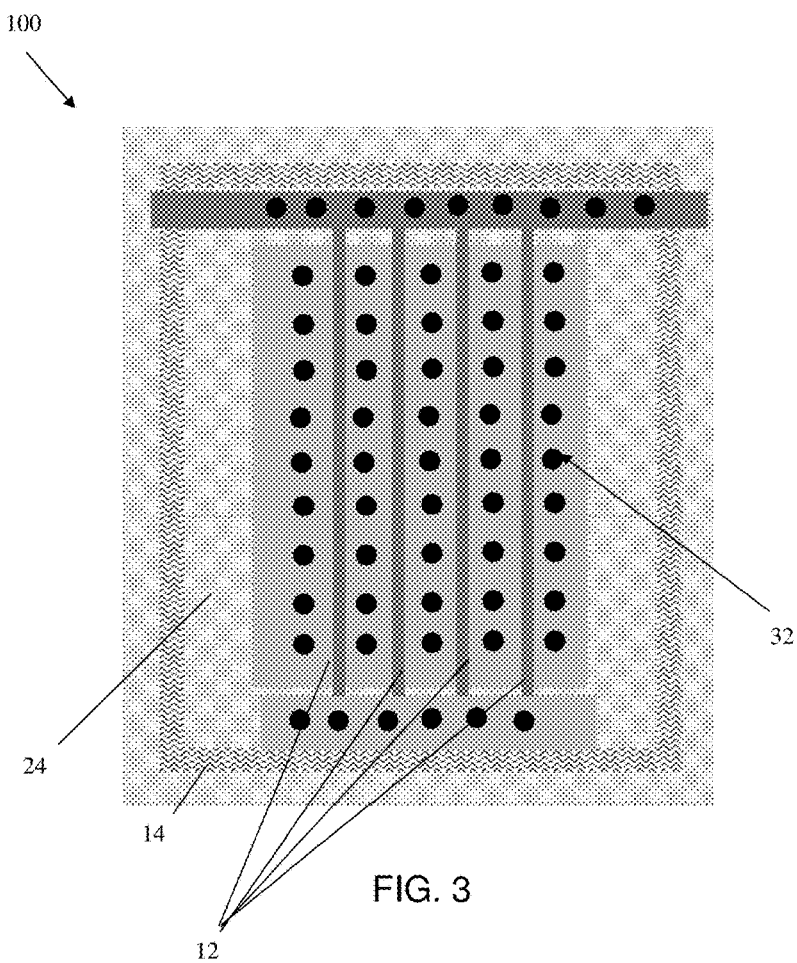
FIG. 3 shows a top view layout of the structures of FIGS. 1 and 2 in accordance with aspects of the present disclosure.

FIG. 3 shows a top view layout view of the structures of FIGS. 1 and 2 in accordance with aspects of the present disclosure. More specifically, the layout view 100 shows a plurality of transistors 12, e.g., RF switches or other FETs, aligned in parallel. In embodiments, the plurality of transistors comprises a multi-finger gate structure. Deep trench isolation structures 14, extending within the STI structures 24 can surround the transistors 12.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
at least one gate structure on a semiconductor substrate;
an interlevel dielectric material above the semiconductor substrate; and
a trench isolation structure with an airgap extending into the semiconductor substrate beyond a depth of a depletion region of the semiconductor substrate and adjacent to the at least one gate structure and its upper portion terminating in the interlevel dielectric material above an upper surface of the semiconductor substrate.

2. The structure of claim 1, wherein the semiconductor substrate is one of a high-resistivity (>1 Kohm–cm) bulk substrate and an ultra-high resistivity (>5 Kohm–cm) bulk substrate.

3. The structure of claim 1, wherein the trench isolation structure is a deep trench isolation structure extending through a shallow trench isolation structure and which is pinched off by the interlevel dielectric material.

4. The structure of claim 3, wherein sidewalls of the deep trench isolation structure are lined with the interlevel dielectric material.

5. The structure of claim 4, wherein the deep trench isolation structure has vertically tapered sidewalls with a lower portion of the deep trench isolation structure within the semiconductor substrate having a wider profile than an upper portion in the semiconductor substrate.

6. The structure of claim 4, wherein the deep trench isolation structure has vertically tapered sidewalls with a lower portion of the deep trench isolation structure within the semiconductor substrate having a narrower profile than an upper portion in the substrate.

7. The structure of claim 3, wherein a top critical dimension of the deep trench isolation structure in the semiconductor substrate is wider than an opening through the shallow trench isolation structure.

8. The structure of claim 1, wherein a sidewall profile of the deep trench isolation structure is scalloped.

9. The structure of claim 1, wherein the depth of the deep trench isolation structure extends into the semiconductor substrate about 65 microns to 100 microns.

10. The structure of claim 1, wherein:
the airgap extends partly in the interlevel dielectric material with a pinch-off of the interlevel dielectric material terminating the airgap; and
the airgap is below a bottom surface of the interlevel dielectric material.

11. A structure comprising:
at least one transistor on a bulk substrate;
shallow trench isolation structures surrounding the at least one transistor;
an interlevel dielectric material above the bulk substrate; and
a deep trench isolation structure passing through the shallow trench isolation structures, extending below a depletion region of the bulk substrate, and terminating at its upper end in the interlevel dielectric material above a top surface of the bulk substrate.

12. The structure of claim 11, wherein the deep trench isolation structure has a tapered profile with sidewalls that are lined with the interlevel dielectric material.

13. The structure of claim 12, wherein the deep trench isolation structure is an airgap which terminates in the interlevel dielectric material, below a polished surface thereof.

14. The structure of claim 12, wherein a lower portion of the deep trench isolation structure within the bulk substrate has a wider profile than an upper portion in the bulk substrate.

15. The structure of claim 12, wherein a lower portion of the deep trench isolation structure within the bulk substrate has a narrower profile than an upper portion in the bulk substrate.

16. The structure of claim 12, wherein a top critical dimension of the deep trench isolation structure in the bulk substrate is wider than an opening through the shallow trench isolation structures.

17. The structure of claim 12, wherein a sidewall profile of the deep trench isolation structure is scalloped.

18. A method comprising:
etching a deep trench isolation structure with tapered sidewalls into a bulk substrate to below a depletion region in the bulk substrate and at least isolating one transistor on the bulk substrate; and
depositing an interlevel dielectric material over the deep trench structure, the interlevel dielectric material lining the deep trench isolation structure with insulator material and forming an airgap in combination with the deep trench isolation structure which terminates in the interlevel dielectric material above an upper surface of the substrate with a pinch off.

19. The method of claim 18, wherein the etching to form the tapered sidewalls is formed by decreasing a polymer deposition cycle time and increasing a Si etch cycle time throughout a cycled etch process.

20. The structure of claim 1, wherein the airgap extends through a shallow trench isolation region and into the semiconductor substrate, the airgap extends above the semiconductor substrate, and a profile of the airgap through the shallow trench isolation region is narrower than a profile of the airgap within the semiconductor substrate, and a pinch off of the airgap terminates in the interlevel dielectric material above the upper surface of the semiconductor substrate.

* * * * *